(12) United States Patent
Roesner et al.

(10) Patent No.: US 11,077,525 B2
(45) Date of Patent: Aug. 3, 2021

(54) METHOD OF PROCESSING A SILICON CARBIDE CONTAINING CRYSTALLINE SUBSTRATE, SILICON CARBIDE CHIP, AND PROCESSING CHAMBER

(71) Applicant: Infineon Technologies AG, Neubiberg (DE)

(72) Inventors: Michael Roesner, Villach (AT); Markus Menath, Regensburg (DE); Gudrun Stranzl, Goedersdorf (AT)

(73) Assignee: Infineon Technologies AG, Neubiberg (DE)

( * ) Notice: Subject to any disclaimer, the term of this patent is extended or adjusted under 35 U.S.C. 154(b) by 204 days.

(21) Appl. No.: 16/374,265

(22) Filed: Apr. 3, 2019

(65) Prior Publication Data

US 2019/0308274 A1  Oct. 10, 2019

(30) Foreign Application Priority Data

Apr. 4, 2018 (DE) .......................... 102018107922.2

(51) Int. Cl.
| | | |
|---|---|---|
| *B23K 26/362* | (2014.01) | |
| *B23K 26/40* | (2014.01) | |
| *H01L 29/16* | (2006.01) | |
| *H01L 21/3065* | (2006.01) | |
| *H01L 21/67* | (2006.01) | |

(52) U.S. Cl.
CPC ............ *B23K 26/362* (2013.01); *B23K 26/40* (2013.01); *H01L 21/3065* (2013.01); *H01L 21/67069* (2013.01); *H01L 29/1608* (2013.01)

(58) Field of Classification Search
CPC ... B23K 26/362; B23K 26/40; H01L 29/1608; H01L 21/3065; H01L 21/67069
See application file for complete search history.

(56) References Cited

U.S. PATENT DOCUMENTS

| | | | | |
|---|---|---|---|---|
| 5,415,126 | A * | 5/1995 | Loboda | C30B 29/36 117/88 |
| 5,631,190 | A * | 5/1997 | Negley | B23K 26/16 438/33 |
| 5,783,255 | A * | 7/1998 | Suda | C04B 35/565 427/227 |
| 7,582,541 | B2 * | 9/2009 | Takeda | B23K 26/0736 438/463 |
| 10,508,361 | B2 * | 12/2019 | Kaneko | H01L 21/02609 |
| 2003/0127428 | A1 | 7/2003 | Fujii et al. | |
| 2005/0082651 | A1 | 4/2005 | Farnworth et al. | |

(Continued)

FOREIGN PATENT DOCUMENTS

| | | |
|---|---|---|
| DE | 112012006211 T5 | 12/2014 |
| DE | 102015100491 A1 | 7/2015 |

(Continued)

*Primary Examiner* — John P. Dulka
(74) *Attorney, Agent, or Firm* — Murphy, Bilak & Homiller, PLLC

(57) ABSTRACT

A method of processing silicon carbide containing crystalline substrate is provided. The method includes pyrolyzing a surface of the silicon carbide containing crystalline substrate to produce a silicon and carbon containing debris layer over the silicon carbide containing crystalline substrate, and removing the silicon and carbon containing debris layer, wherein the pyrolyzing and the removing is repeated at least once.

31 Claims, 11 Drawing Sheets

(56) References Cited

U.S. PATENT DOCUMENTS

| | | | | |
|---|---|---|---|---|
| 2007/0264799 A1* | 11/2007 | Takeda | ................. | B23K 26/40 |
| | | | | 438/463 |
| 2010/0102292 A1* | 4/2010 | Hiura | ............. | H01L 21/823828 |
| | | | | 257/9 |
| 2014/0248757 A1 | 9/2014 | Morikazu et al. | | |
| 2016/0199944 A1 | 7/2016 | Hosseini | | |
| 2018/0226247 A1* | 8/2018 | Chahal | ............. | H01L 21/02667 |

FOREIGN PATENT DOCUMENTS

| | | | | |
|---|---|---|---|---|
| DE | 102016111325 A1 | 12/2016 | | |
| DE | 102018203879 A1 | 9/2018 | | |
| JP | H11505666 A | 5/1999 | | |
| JP | 2005333122 A | * 12/2005 | | |
| JP | 2007305646 A | * 11/2007 | ............ | H01L 21/78 |
| JP | 2008068263 A | * 3/2008 | | |

* cited by examiner

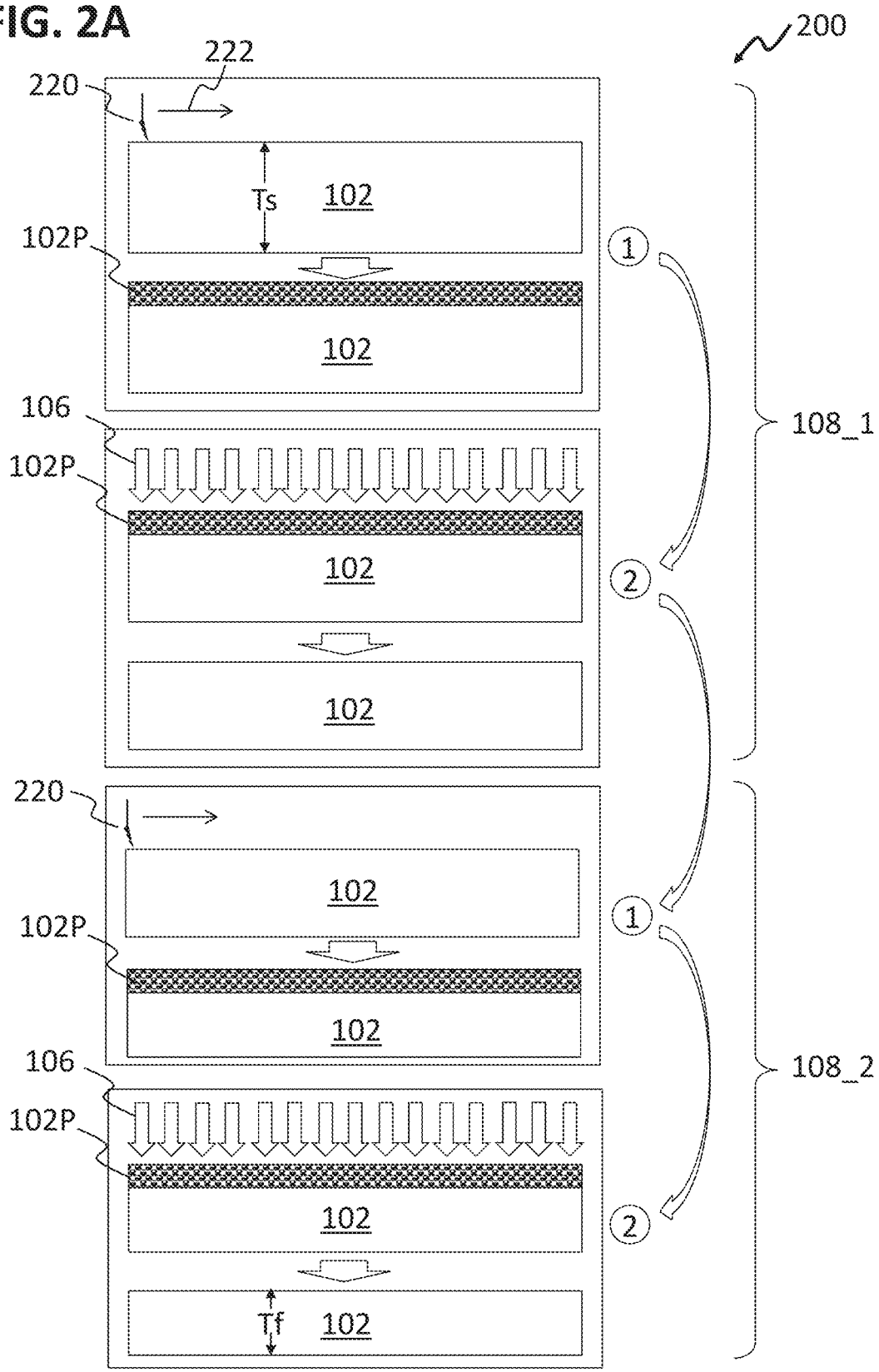

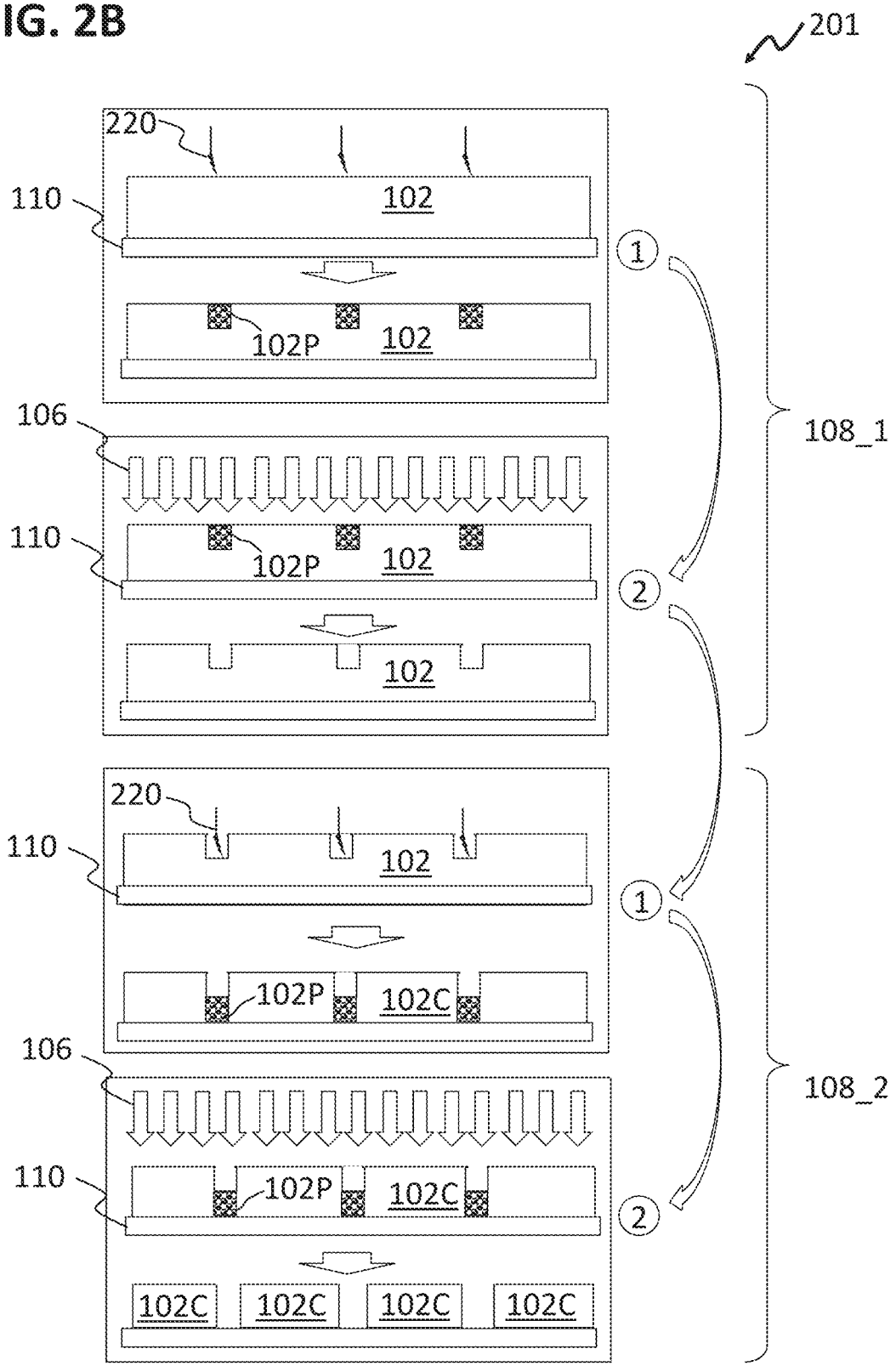

METHOD OF PROCESSING A SILICON CARBIDE CONTAINING CRYSTALLINE SUBSTRATE, SILICON CARBIDE CHIP, AND PROCESSING CHAMBER

TECHNICAL FIELD

Various embodiments relate generally to a method of processing a silicon carbide containing crystalline substrate, a silicon carbide chip, and a processing chamber.

BACKGROUND

At present, for a production of leading-edge silicon carbide (SiC) technologies like e.g. SiC Schottky diodes or MOSFETs, a thinning and dicing/preassembly process is severely limited by the high mechanical hardness of the SiC material. For example, during a state-of-the-art mechanical grinding/dicing process, abrasive mechanical material removal may lead to significant mechanical damage in the SiC material. State-of-the-art SiC laser dicing, which may currently be used in a production of SiC-based diodes, an exemplary 16-pass dry ns-pulse laser process may create a debris layer of graphite and tensile stressed silicon (Si). The process may be slow, thus having a low throughput. Furthermore, a 3-point breaking strength of the SiC dies may be significantly reduced. State-of-the-art plasma dicing of SiC wafers, utilizing e.g. $ClF_3$ etching gases, are currently limited by a low etching rate of less than 1 µm/min, which may lead to very long etching times. In addition, thick metal hard masks having a thickness of up to 10 µm to 15 µm metal thickness, may be required for the etching process, which makes the process very expensive.

SUMMARY

A method of processing silicon carbide containing crystalline substrate is provided. The method may include pyrolyzing a surface of the substrate to produce a silicon and carbon containing debris layer over the silicon carbide containing crystalline substrate, and removing the silicon and carbon containing debris layer, wherein the pyrolyzing and the removing is repeated at least once.

Those skilled in the art will recognize additional features and advantages upon reading the following detailed description, and upon viewing the accompanying drawings.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 2A and 2B each show a visualization of a method of processing a silicon carbide containing crystalline substrate in accordance with various embodiments;

DETAILED DESCRIPTION

Figure 1A:
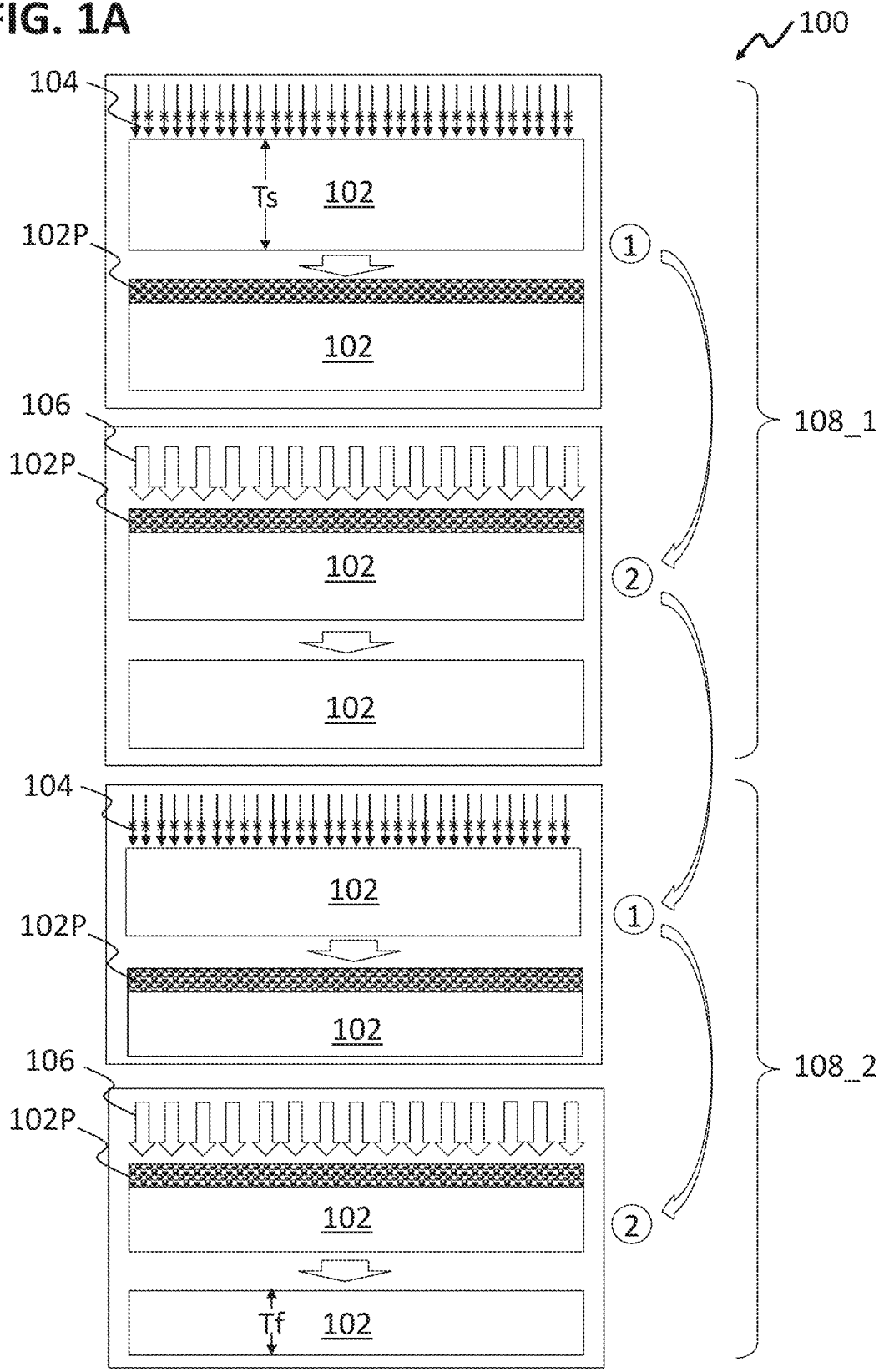
FIG. 1A to FIG. 1C each show a visualization of a method of processing a silicon carbide containing crystalline substrate in accordance with various embodiments.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

To alleviate the mechanical damage caused by the grinding/dicing as described above, in a state-of-the-art combined process, an ultrasonic supported mechanical dicing and grinding is used, which may reduce the mechanical due to an improved self-sharpening of the diamond grains of the grinding/dicing wheels by the ultrasonic vibration. However, the grinding/dicing induced near surface mechanical damage of the SiC is only reduced by approximately 10-15%.

Heating of a wafer chuck for increasing the etching rate is a state-of-the-art technique during plasma dicing. This may reduce an etching time for the $ClF_3$ etching process. However, for this plasma dicing process, thick metal hard masks are still required to get sufficient selectivity with respect to SiC. The thick metal hard masks are very expensive to manufacture and complicated to remove after the plasma dicing.

In various embodiments, a laser assisted plasma thinning and dicing includes a step-wise removal of SiC, wherein the SiC is decomposed into Si and C prior to a plasma etching process.

In various embodiments, energy may be supplied to a surface of a silicon carbide containing crystalline substrate such that the surface pyrolyzes into silicon and carbon without undergoing a melting of the silicon carbide, which would for example lead to a forming of 3C—SiC. Subsequently, the silicon and the carbon may be removed. An etchant suitable for removing the silicon and the carbide may have a high etch selectivity with respect to silicon carbide, such that the thick metal hard masks may not be required. In various embodiments, it may even be possible to completely omit the mask. The two-part-process of pyrolyzing and removing may be repeated at least once, e.g. two, three, four or more times, for example until a desired thickness of the substrate at the position of the surface is obtained. The alternating of two different processes for removing material, e.g. for forming an opening, may be in some ways similar to the known Bosch process used for forming openings in silicon.

The silicon carbide substrate may be a (circular or polygonal, in particular hexagonal) disc of polycrystalline or monocrystalline silicon carbide, in particular a silicon carbide wafer, and/or a prism-shaped (e.g., with a circular or polygonal, in particular hexagonal, base) silicon carbide ingot (also called: boule). Although in the following the method may be described in connection with a silicon carbide substrate that may already comprise device structures, the method may also be used for thinning and/or polishing and/or dicing a silicon carbide ingot without device structures.

The two-part process may for example be used for thinning a silicon carbide substrate, e.g. thinning a silicon carbide wafer from its backside. The two-part process may also be used for polishing a silicon carbide substrate, e.g. by removing a surface roughness. A complete main surface or a portion of the surface may be thinned. In this case, the processing may be stopped after an etching when a desired resulting thickness of the substrate is achieved.

The two-part-process may for example be used for dicing a silicon carbide substrate, e.g. a wafer, into individual chips. In that case, the process may for example be repeated until the chips are diced. In other words, a surface between individual chips of the substrate (so-called kerf region) may be treated by the two-part process until the whole thickness of the substrate is removed in the kerf region. Alternatively, a small fraction of the thickness of the substrate may be left after the two-part-process of pyrolyzing and removing, and the dicing process may be completed by, e.g., breaking the substrate between the chips where the substrate was mostly removed.

A laser may in various embodiments be used for supplying the energy to the surface of the silicon carbide containing crystalline substrate. A laser dose and laser pulse duration used for an annealing of the substrate may be optimized in such a way that any formation of 3C—SiC from e.g. the 4H— or 6H—SiC base material will not take place. The laser annealing process may generate, via pyrolysis, a near surface debris layer of Si and C (with a thickness of e.g. 1-5 µm per laser treatment).

The laser processing may for example be applied in the kerf regions for dicing of the substrate, and/or on the whole substrate (e.g. wafer) backside for a thinning of the substrate. For example, the laser may be scanned over at least 90% of the surface of the substrate along parallel lines. A distance between neighboring lines may be at least 10 µm (or at least 50 µm or at least 100 µm) and at most 1 mm (e.g., at most 500 µm or at most 300 µm).

This laser annealing step may in various embodiments be followed by an $Ar/O_2$ and $SF_6$ plasma etching process for a removal of the C and Si, respectively.

Subsequently, the etching process may be followed by a second laser annealing, which may produce a second debris layer on top of a thinned SiC surface. This layer, again, may be removed by plasma etching.

This sequence of laser annealing and plasma etching may in various embodiments be repeated until the target thickness is reached for thinning and/or until the kerf is diced to a bottom of the substrate, e.g. the wafer, for die separation.

Using this process combination, it may be possible to use conventional hardmasks for Si and C etching which are less expensive than thick metal hard masks (or even to omit the hard masks altogether), and to increase the etching rate significantly for a high thinning and dicing throughput.

An absence of any mechanical abrasion during the thinning/dicing may eliminate the mechanical damage in the thinned and diced SiC chips, and may lead to a significant increase of the mechanical breaking strength of the SiC chips. In backend processing, this may allow for a robust die pick-up, die attach and packaging with high u.p.h. (units per hour) throughput.

In various embodiments, the energy may be supplied to the substrate in other ways than with a laser, for example using micro-spark erosion (=micro electric discharge machining).

In various embodiments, the removing of the silicon and the carbon may be performed in other ways than with plasma etching, for example using wet etching.

FIG. 1A to FIG. 1C, FIG. 2A, FIG. 2B and FIG. 3 each show a visualization of a method of processing a silicon carbide containing crystalline substrate 102 in accordance with various embodiments.

The silicon carbide containing crystalline substrate 102 may include, consist of or essentially consist of silicon carbide (SiC) and may herein be referred to as substrate 102 for short. The substrate 102 may for example be a block of pure or essentially pure silicon carbide. The substrate 102 may for example be a silicon carbide wafer, which may include a plurality of chips 102C (see e.g. FIG. 1B, FIG. 2B and FIG. 3 (right column)). Thus, in particular in a region of the substrate 102 where the chips 102C are formed, the substrate 102 may for example include doping materials, metallizations, insulation layers, and the like. The substrate 102 may for example be a combination of silicon carbide with gallium nitride, for example silicon carbide grown on a base substrate of gallium nitride.

Figure 1B:
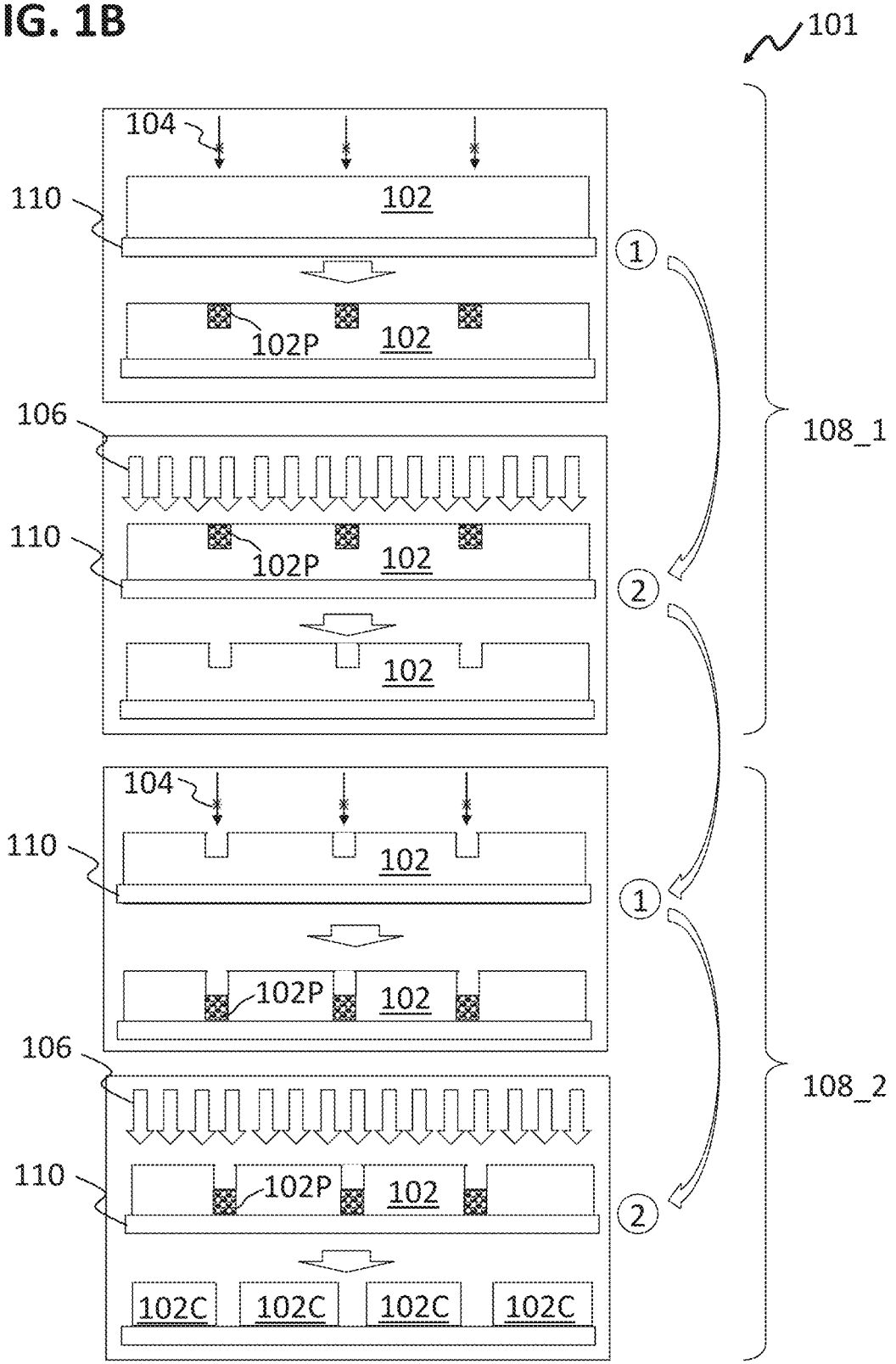
Figure 3:
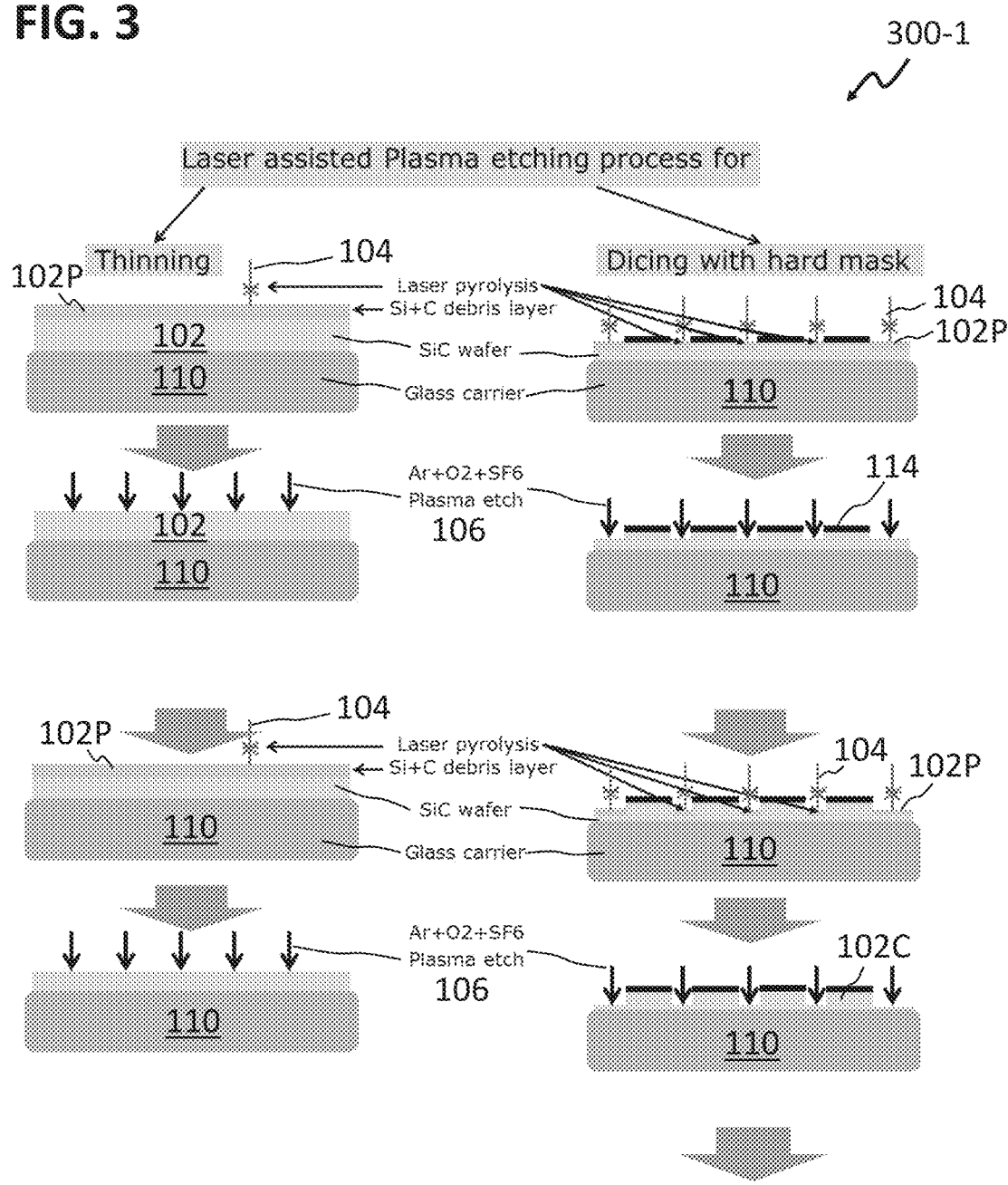
FIG. 3 shows visualizations of two methods of processing a silicon carbide containing crystalline substrate in accordance with various embodiments.
Figure 3:
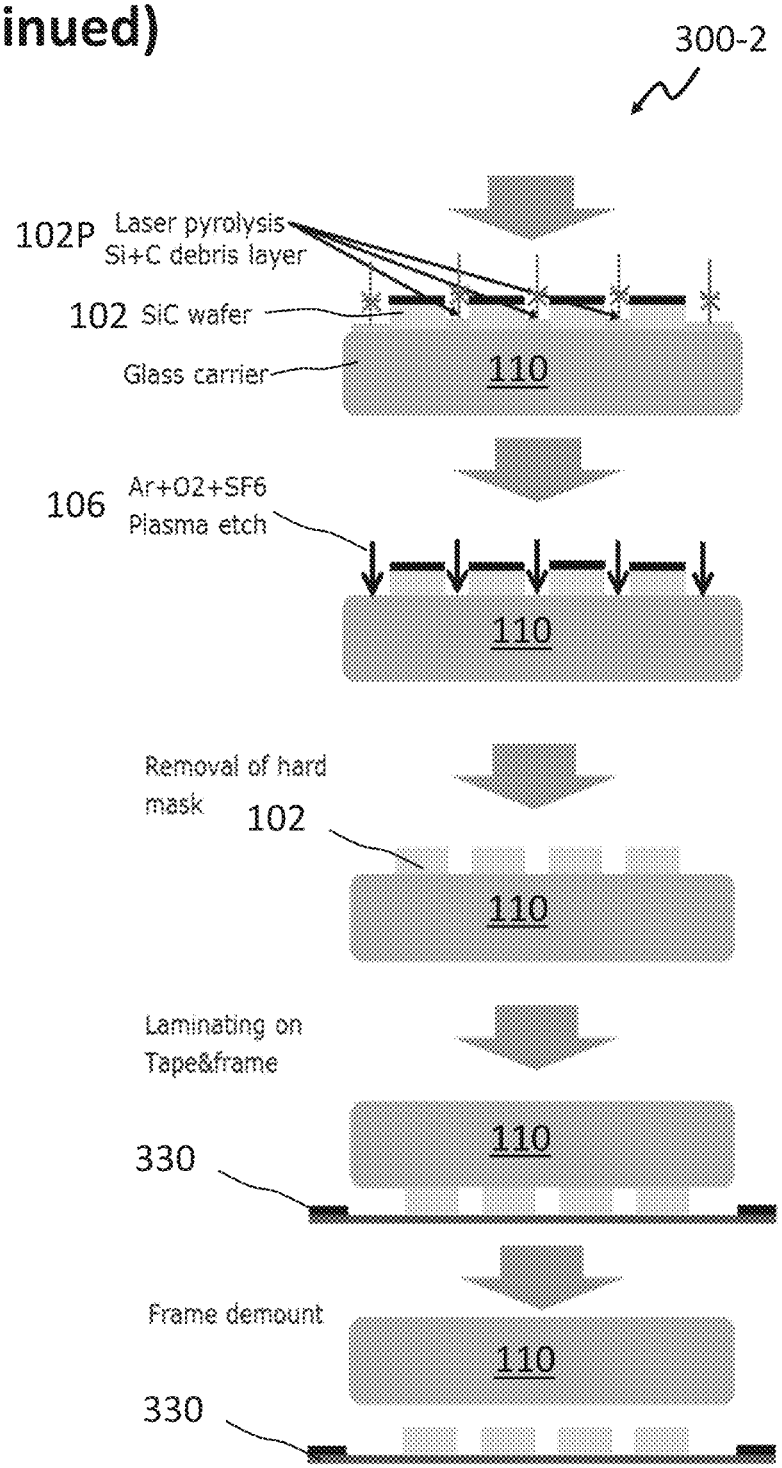

FIG. 1A, FIG. 2A and FIG. 3 (left column) show various embodiments of a thinning process of a silicon carbide containing crystalline substrate 102, and FIG. 1B, FIG. 2B and FIG. 3 (right column) show various embodiments of a dicing method of a silicon carbide wafer 102.

As shown in FIG. 1A and FIG. 2A, the substrate 102 may have an initial thickness Ts, which may be a conventional initial thickness of a silicon carbide wafer 102, for example in a range from about 80 µm to about 700 µm, typically e.g. between 110 µm and 380 µm.

Unless it is clear from the context that something else is intended, the term "a surface" or "the surface" (labelled in the figures as 102S) is meant to refer to (the portion of) a main surface of the substrate 102 that is to be thinned by the two-part process that is to be described in the following.

For thinning the substrate 102, either over one whole main surface as shown in FIG. 1A, FIG. 2A and FIG. 3 (left column), or over a portion of a whole main surface (not shown, for example in a central region of the main surface, while leaving an edge portion of the substrate 102 unthinned or only partially thinned), a surface 102S of the substrate 102 may be pyrolyzed. Pyrolyzing may refer to a breaking of covalent bonds in the crystalline silicon carbide, resulting in a formation of silicon and carbon. It is to be distinguished from, e.g., a melting of the silicon carbide, which may lead to a forming of 3C—SiC.

In order to achieve the pyrolyzation, energy may be supplied to the surface 102S of the substrate 102 where the crystalline silicon carbide is exposed. For example, in a case of the substrate including a gallium nitride base substrate, the energy may be provided to the surface opposite the gallium nitride base substrate, where the silicon carbide may be exposed.

As shown in FIG. 1A, FIG. 1B, FIG. 1C and FIG. 3, the energy may be supplied as laser light 104 by at least one laser. The pyrolyzing process is indicated by a 1 in the respective figures.

An irradiation of the whole surface 102S to be thinned may for example be achieved by scanning the at least one laser across the substrate 102 while irradiating at least one portion of the surface 102S at a time with the laser light 104. In that case, a single beam of laser light 104 or a plurality of beams of laser light 104 may be scanned in a pattern that supplies each portion of the surface 102S with a suitable energy dose or intensity (see below) for pyrolyzing the surface 102S.

In various embodiments, a beam expander may be used for increasing a beam size of the at least one laser, and thus the portion covered at any given time by the at least one laser.

In various embodiments, a plurality of lasers may be used (e.g. in combination with beam expansion) for irradiating the whole surface 102S simultaneously. In that case, the substrate 102 and the at least one laser may be stationary at least during the pyrolyzing.

In various embodiments, a combination of a plurality of lasers (with or without beam expansion) and scanning may be used. For example, in the embodiments shown in FIGS. 1B and 1C each of the three beams of laser light 104 for dicing the substrate 102 (e.g. a silicon carbide wafer 102) into individual chips 102C, may be provided by an individual laser, and the plurality of lasers (e.g. three lasers) may be scanned across the wafer 102 for forming (e.g. three) kerfs in kerf regions between the chips 102C of the wafer 102. The scanning in the embodiments of FIGS. 1B and 1C may be performed in a direction into and out of a plane of the paper.

Figure 1C:
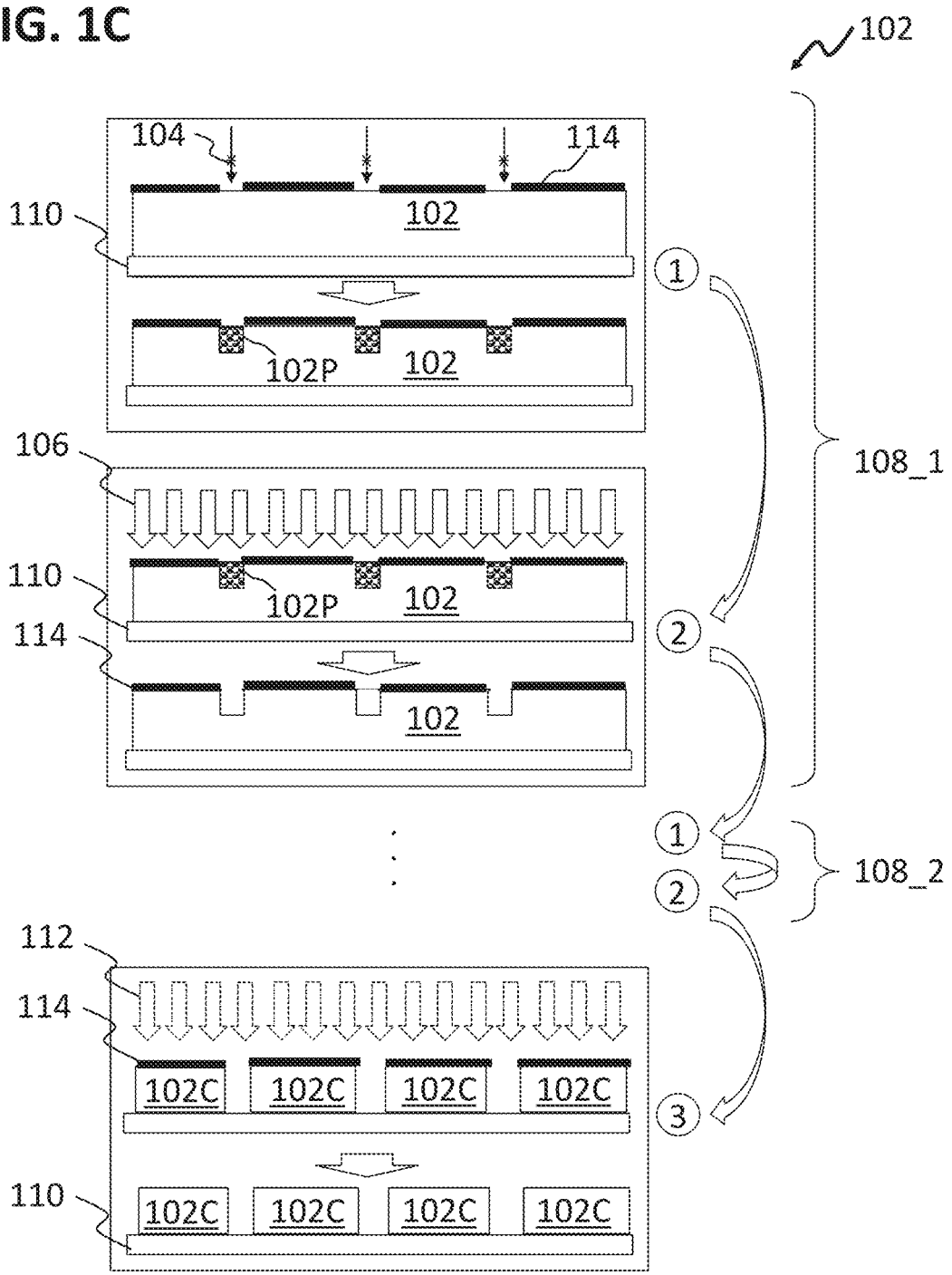

In a case of using a single laser in the embodiments of FIG. 1B or FIG. 1C, the laser may be scanned along the direction of the kerf region (e.g., into and out of the plane of the paper), and may be stepped, e.g. without irradiating or at least without pyrolyzing the wafer 102, from one kerf region to the next.

The scanning and/or stepping of the at least one laser with respect to the substrate 102 may in various embodiments be controlled by a motion control unit and may include moving the substrate 102, moving the at least one laser, or both. In a case of moving both, the substrate 102 and the at least one laser, the motion control unit may be configured to coordinate the motion of the substrate 102 and the motion of the laser in order to obtain a desired scanning and/or stepping pattern.

In various embodiments, the essentially point-like (or small circular) shape of the laser light beam, together with a high positioning accuracy, may be used for shaping the surface 102S in essentially desired way. For example, the pyrolyzing may be conducted on the substrate 102 in a honeycomb structure, and if the two-part procedure described herein is continued through the whole substrate, chips 102C with hexagonally shaped main surfaces may thereby be formed. In general, chips 102C with essentially any shape of their main surfaces may be created, e.g. with rectangular-rounded-edged, circular, oval, rhombic, or star-shaped surfaces, and the like.

In a case of only thinning the substrate 102, similarly, openings with an arbitrarily shaped area may be formed in the substrate, e.g. hexagonal, circular, oval, rhombic, or star-shaped openings, and the like.

It is to be understood that "moving the laser" may, in a more general sense, also include techniques in which the laser itself may be stationary, and optical elements like mirrors and/or lenses etc. may be moved for moving the laser beam.

In various embodiments, as shown in FIG. 2A and FIG. 2B, the energy may be supplied by micro-spark erosion (=micro electrical discharge machining).

As shown in FIGS. 2A and 2B, at least one wire 220W of a micro-spark erosion device, which may form an electrode 220W of the device, may be arranged above the surface 102S without contacting the surface 102S. The wire 220W and the surface 102S (possibly but not necessarily the whole substrate 102) may be immersed in a polar liquid, e.g. water (not shown in FIG. 2A and FIG. 2B, but see e.g. FIG. 4B).

During an operation of the micro-spark erosion device, a spark may form between the wire 220W and the surface 102S of the substrate 102, thereby supplying the energy to the surface 102S.

In various embodiments, a single wire 220W (as for example shown in FIG. 2A) or a plurality of wires (as shown in FIG. 2B) may be arranged above the surface, and the wire(s) 220W may be scanned across the substrate 102 for pyrolyzing the surface 102S.

Similar to the embodiments described above in context with FIG. 1A to 1C and FIG. 3, the whole surface 102S to be thinned may for example be performed by scanning the at least one wire 220W across the substrate 102 while operating the micro-spark erosion device, such that at least one spark per wire 220W may form between the at least one wire 220W and at least one portion of the surface 102S at any given time. In that case, the at least one wire 220W may be scanned across the substrate 102 in a pattern that supplies each portion of the surface 102S with a suitable energy dose or intensity (see below) for pyrolyzing the surface 102S.

In various embodiments, the at least one wire 220W may include at least one section that is parallel to the surface 102S. In that case, sparks may form along the parallel section, thereby simultaneously pyrolyzing e.g. a whole length of a kerf region. Thus, a scanning of the wire 220W along the kerf region may be omitted.

The plurality of wires 220W may in various embodiments be arranged parallel to each other, for example in such a way that above each kerf region extending along a given direction, a wire 220W is placed. In that case, all the kerf regions extending along the given direction may be pyrolyzed at the same time. For a pyrolyzing of the kerf regions extending in a different, e.g. orthogonal, direction, the substrate 102 may be rotated with respect to the plurality of wires, or vice versa. Instead of pyrolyzing all the kerf regions extending along the given direction at the same time, a combination of using a plurality of wires 220W for pyrolyzing several kerf regions at the same time and stepping to a further position for pyrolyzing several further kerf regions may be used.

In various embodiments, a grid-shaped electrode 220W may be used for pyrolyzing the kerf regions of the two directions at the same time, and/or for shaping the surface 102S to by pyrolyzed more or less arbitrarily.

In various embodiments, the wire (the electrode) 220W may be arranged without the parallel portion, and instead include a portion that is essentially vertical to the surface 102S. This may allow for shaping the surface 102S in a complex pattern by scanning the wire 220W accordingly across the substrate 102.

The energy supplied to the surface 102S may have an intensity in a range from about 1 $J/cm^2$ to less than 10 $J/cm^2$, e.g. from about 2 $J/cm^2$ to about 5 $J/cm^2$. Providing the energy with this dose may ensure that the pyrolysis of the silicon carbide is achieved, rather than a melting of the silicon carbide, or no reaction. The laser energy may be deposited continuously, or in pulses with a duration of e.g. nanoseconds, picoseconds or femtoseconds.

For an adjustment of the energy supplied to the surface 102S, several parameters of the energy supply device and/or of the substrate 102 and/or of their relative position and/or interaction may need to be taken into account. For example in a case of the laser, an energy of the laser beam, a beam width, a wavelength of the laser light 104, the laser pulse duration, a scanning velocity (if applicable), an absorption coefficient of the substrate, and the like, may need to be considered. For example in a case of the micro-spark erosion, a voltage supplied to the electrode 220W, a shape of the electrode, a distance to the surface 102S, and the like, may need to be considered.

A pyrolyzed layer 102P containing (e.g. consisting of or essentially consisting of) silicon and carbon debris formed by the pyrolyzing may in various embodiments have a thickness in a range from about 1 µm to about 10 µm, e.g. from about 3 µm to about 7 µm, e.g. about 5 µm.

In various embodiments, as indicated by "2" in the figures, the pyrolyzing may be followed by a removing of the silicon and carbon containing debris 102P formed by the pyrolyzing.

The removing may in various embodiments include an etching of the silicon and carbon debris 102P. For the etching, an etchant may be used that is suitable for removing the debris layer 102P.

The etching may for example be a plasma etching process or a wet etching process, e.g. a spin etching process.

In a case of the plasma etching, the etchant may for example include, consist of or essentially consist of Ar, $O_2$, and $SF_6$.

In a case of the wet etching, the etchant may for example include, consist of or essentially consist of a combination of e.g. $H_2SO_4$, HF, $HNO_3$ and $H_3PO_4$, which may for example be applied using a spin etching process.

The pyrolyzing of the surface 102S and the subsequent removal of the silicon and carbon containing debris may be referred to as one process cycle 108, or cycle, for short. The first cycle may thus be labelled 108_1, the second cycle as 108_2, etc., see e.g. FIG. 1A to 1C and FIGS. 2A and 2B.

After the removing the debris, a new portion of the main surface of the substrate 102 may be exposed, which may form the new surface 102S to be pyrolyzed in a second pyrolyzing process. The silicon and carbon containing debris 102P from the second pyrolyzing process may be removed in a second removal process, thereby completing the second cycle 108_2.

In various embodiments, a number of cycles 108 to be executed may be adjusted according to a thickness of the material to be removed. For the following examples, it is assumed that one cycle removes about 5 µm of the substrate 102. For example, in a case of thinning a wafer 102 having an initial thickness of about 380 µm to a thickness of about 110 µm, thus removing about 270 µm, approximately 54 cycles may be required. Dicing a wafer 102 having a thickness of 380 µm may for example require approximately 76 cycles, and dicing a wafer having a thickness of about 110 µm may require about 22 cycles. If more substrate 102 material is removed per cycle 108, fewer cycles 108 may be needed. Accordingly, if less substrate 102 material is removed per cycle 108, more cycles 108 may be needed.

In various embodiments, due to the possibility to finely adjust a position where the energy is supplied to the surface 102S (generally, this may apply to both, the laser and the micro-spark erosion device), and because the etchant that may be suitable for the removing of the debris 102P may have a large etch selectivity with respect to silicon carbide, it may be obsolete to use a structured mask 114 for the structuring of the silicon carbide substrate 102.

However, in various embodiments, e.g. in a case of dicing a wafer 102 from its front side, which may include active regions of the chips 102C, the active regions may be protected by a mask 114. Other cases may for example include protecting a backside metallization of the chips 102C (e.g., for MOSFETs and diodes the (hard-)mask 114 may have to be on top of the structured backside metallization prior to plasma dicing), and/or using an etchant that may have a lower etch selectivity and may thus also partly etch the silicon carbide during the removal of the silicon and carbon containing debris 102P.

Thus, in various embodiments, a structured mask 114 may be formed over the substrate 102, e.g. on the side of the substrate 102 that may be exposed to the etchant. The structured mask 114 may be structured in such a way that the surface 102S to be pyrolyzed may be exposed. Other regions, at least on that side of the substrate 102, may be covered by the structured mask 114.

In various embodiments, the structured mask 114 may be formed on the substrate 102 by known photolithographic processes. In various embodiments, the structured mask 114 may be formed by forming a layer of a mask material, e.g. silicon nitride or the like, over the substrate 102, and by subsequently structuring the mask 114 using a laser, e.g. the laser that is used for the pyrolyzing.

In a case of using a structured mask, as for example shown in FIG. 1C and in FIG. 3 (right column), the mask 114 may in various embodiments be removed after a completion of the thinning/dicing cycles 108. In various embodiments, the mask 114 may remain on the substrate 102, e.g. on each of the plurality of chips 102C formed by the dicing process. The mask 114 may for example be functional for a stabilization of the substrate 102, e.g. the chip 102C, or for a die attach process.

In a case of removing the mask 114, a mask removal process (see FIG. 3, right column) may be executed subsequent to the completion of the cycles 108. The mask removal process may be executed as known in the art, for example using plasma etching or wet etching. The mask removal may in various embodiments be executed in the same processing chamber as the pyrolyzing and the removing process.

In various embodiments, a further processing of the thinned/diced substrate 102 may be similar to thinned/diced substrates 102 as known in the art. For example, as shown in FIG. 3 (right column), the wafer 102 that is diced into the plurality of diced chips 102C by the structuring process may be mounted on a (glass) carrier 110 during the structuring, and may, after the structuring, be laminated onto a chip carrier tape 330.

The two-part process described above may be considered a laser assisted plasma thinning and dicing method.

The process may be used for a Laser Assisted Plasma Dicing after Grinding (LAPDAG) ("the term "grinding" is used here for consistency with the standard terminology, even though the substrate is not actually mechanically ground, using instead the thinning also for the backside "grinding" in the dicing-after-grinding. For example, the grinding could be performed using the thinning process as shown in FIG. 1A, FIG. 2A and/or FIG. 3 (left column), and the subsequent dicing may be performed using the dicing process as shown in FIG. 1B, FIG. 1C, FIG. 2B or FIG. 3 (right column). Of course, it would also be possible to perform the grinding of the substrate 102 conventionally, and use the process in accordance with various embodiments only for the dicing, or vice versa.

The two-part process in accordance with various embodiments may not only be applied in the Plasma Dicing After Grinding (PDAG) process, but also for a Plasma Dicing Before "Grinding" (PDBG) of SiC wafers 102. In this case, the dicing process as shown in FIG. 1C or FIG. 3 (right column) may be used for an incomplete dicing of the wafer 102 from its front side including the active areas of the chips 102C, followed by a thinning ("grinding") from the back side using the thinning process in accordance with various embodiments, e.g. as shown in FIG. 1A, FIG. 2A and/or FIG. 3 (left column).

In various embodiments, an advantage of using the process in accordance with various embodiments may be that grinding tracks on a backside of the substrate 102 may be avoided. Likewise, the backside of the silicon carbide substrate 102 may be free from (e.g. tensile) stress and from dislocations, i.e. dislocated regions in the crystal.

A duration of each cycle 108 may depend on a duration of the pyrolysis and a duration of the removal.

The duration of the pyrolysis may in various embodiments depend on a scanning/stepping requirement, and may range from about 1 second for a stationary pyrolyzing, in which the whole surface 102S is pyrolyzed in one single position, and about 30 minutes or more for a complex pattern and/or large surface 102S involving scanning and/or stepping.

The duration of the removal process may depend on the selected removal, e.g. etching, process, on the selected etchant, and on the temperature of the substrate 102 and/or the etchant. In general, etching the silicon and carbon containing debris may be about an order of magnitude faster than the silicon carbide etching process according to the state of the art. The duration of the removal process may for example be in a range from about 15 seconds to about 2 minutes.

In various embodiments, the duration of each cycle 108 may further depend on a transfer time between the pyrolyzing process and the removing process. In other words, the time it takes to make the substrate 102 ready for the subsequent process after finishing a present process.

Figure 4A:
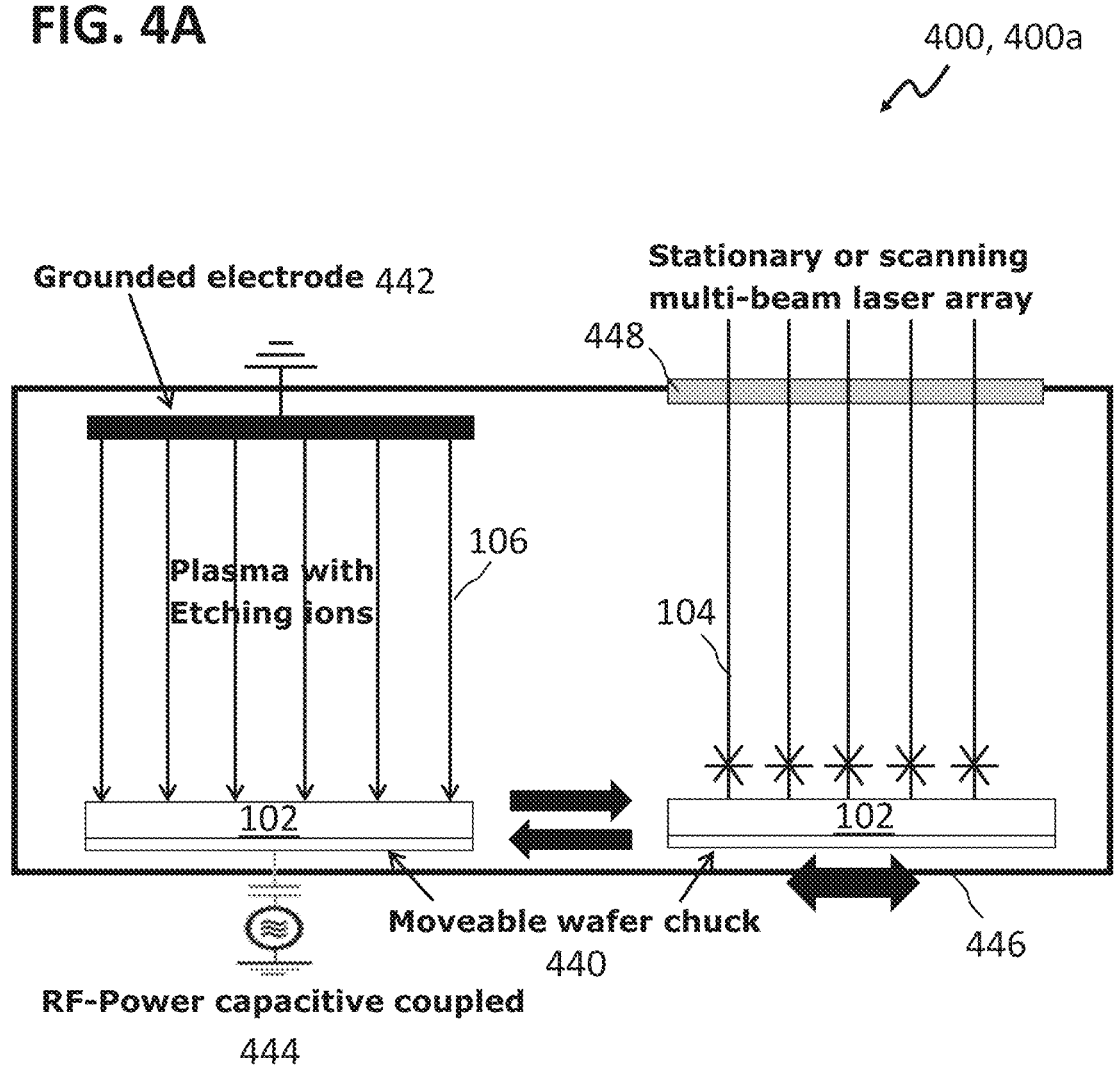
FIGS. 4A and 4B each show a processing chamber in accordance with various embodiments.
Figure 4B:
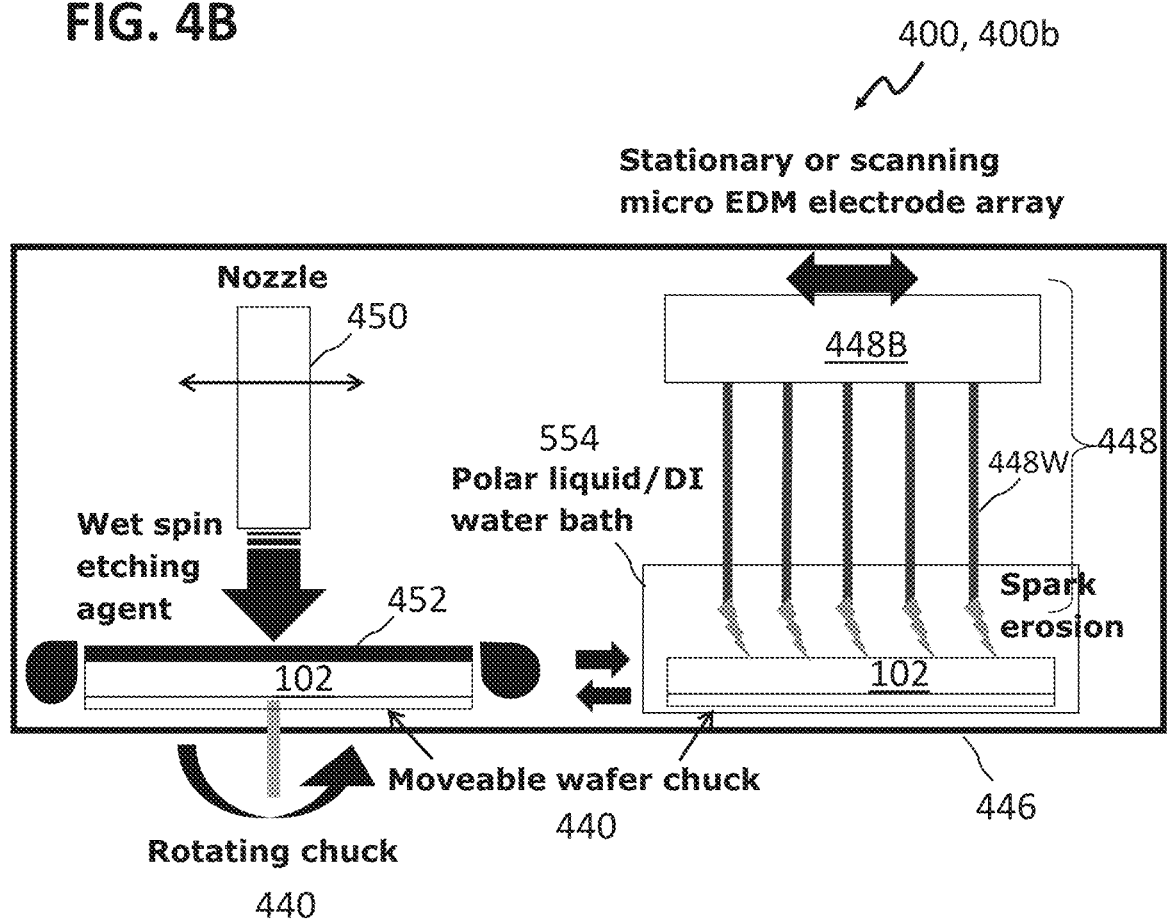

In various embodiments, both processes, the pyrolyzing and the removing, may be executed within a common processing chamber 400. Exemplary processing chambers in accordance with various embodiments are shown in FIGS. 4A and 4B, respectively. The transfer time may be minimized by the application of both processes within the same processing chamber 400, which may make a removal of the substrate between the processes obsolete.

Each of the processing chambers 400, 400a of FIG. 4A and 400, 400b of FIG. 4B may include an energy supply device configured to pyrolyze a surface of a silicon carbide containing crystalline substrate to produce a silicon and carbon containing debris layer over the silicon carbide containing crystalline substrate.

In FIG. 4A, the energy supply device includes at least one laser 438, e.g. a stationary or scanning multi-beam laser array, which may be configured to irradiate a substrate 102 with one or more laser beams 104. The at least one laser 438 may be arranged outside a housing 446 of the processing chamber 400, and the laser light 104 may enter the housing 446 through a window 448, as shown in FIG. 4A. Alternatively, the at least one laser 448 may be arranged within the housing 446.

In FIG. 4B, the energy supply device includes an electric discharge machining (EDM) device 220 including at least one electrode 220W, e.g. at least one wire 220W. The EDM device 220 may for example be a stationary of scanning micro EDM electrode array, which may be configured to supply energy to the substrate 102 by sparks forming between the at least one electrode 220W and the surface 102S, thereby pyrolyzing the surface 102S. The at least one electrode 220W, as shown in FIG. 4B, may be arranged in a polar liquid, e.g. deionized water, together with at least the surface 102S, possibly with the whole substrate 102.

Each of the processing chambers 400, 400a of FIG. 4A and 400, 400b of FIG. 4B may further include a removing device configured to remove the silicon and carbon containing debris layer 102P (in FIG. 4A and FIG. 4B, the substrate is shown at the start of the pyrolyzing process and after finishing the debris removal process, respectively, such that the debris 102P is not shown in FIG. 4A and FIG. 4B, but compare FIG. 1A to 1C, FIG. 2A, FIG. 2B and FIG. 3).

In FIG. 4A, the removing device is a plasma etching device configured to direct an etchant 106 including or consisting of a plasma including etching ions towards the substrate 102. The plasma etching device may for example include a grounded electrode 442 supplying the etching ions 106 and an RF power source 444, which may be capacitively coupled to the substrate 102. In various embodiments, the power source 444 may be arranged outside the housing 446 of the processing chamber 400a. Alternatively, the power source 444 may be arranged inside the housing 446.

In FIG. 4B, the removing device is a wet etching device configured to direct a liquid etchant 452 towards the substrate 102. The wet etching device may be a wet spin etching device. In other words, the liquid etchant 452 may be removed from the substrate 102 by rotating the substrate 102, e.g. by rotating a wafer chuck 440 that the substrate 102 is mounted on. Centrifugal force may cause the liquid etchant 452 to be removed in a radial direction, as shown in FIG. 4B.

In various embodiments, the processing chamber 400 may further be configured to repeat the pyrolyzing and the removing at least once. The processing chamber 400 may for example be configured, e.g. using a progress control unit (not shown) to measure a number of cycles 108 and/or to measure an initial thickness and/or a current thickness of the substrate 102 in regions where the substrate 102 is removed. At least two cycles 108 may be required for processing the substrate 102 in order to achieve a final target thickness (the final thickness Tf is not shown here, but visualized for the thinning process of FIG. 1A and FIG. 2A). The progress control unit may be configured to stop the processing of the substrate 102, e.g. stop the processing chamber 400 from executing further cycles 108, when it is determined that the final thickness Tf is reached, e.g. because the measured thickness corresponds to the final thickness, and/or because a predefined number of cycles was executed.

In various embodiments, the processing chamber 400 may be configured to have the substrate 102 remain in the processing chamber 400 between the pyrolyzing and the removing.

In various embodiments, the processing chamber 400 may include a moveable substrate support structure 440 configured to move the substrate 102 from a position for the pyrolyzing to a position for the etching and vice versa.

The moveable substrate support structure 440 may further be configured to move the substrate 102 during the pyrolyzing in order to scan the energy supply device across the substrate.

Even though a combination of laser and plasma etching device is shown in FIG. 4A, and a combination of micro-spark erosion device and wet etching device is shown in FIG. 4B, it is to be understood that the processing chamber 400 may in various embodiments include the laser as the energy supply device and the wet etching device as the removal device, or may in various embodiments include the micro-spark erosion device as the energy supply device and the plasma etching device as the removal device.

Figure 5:
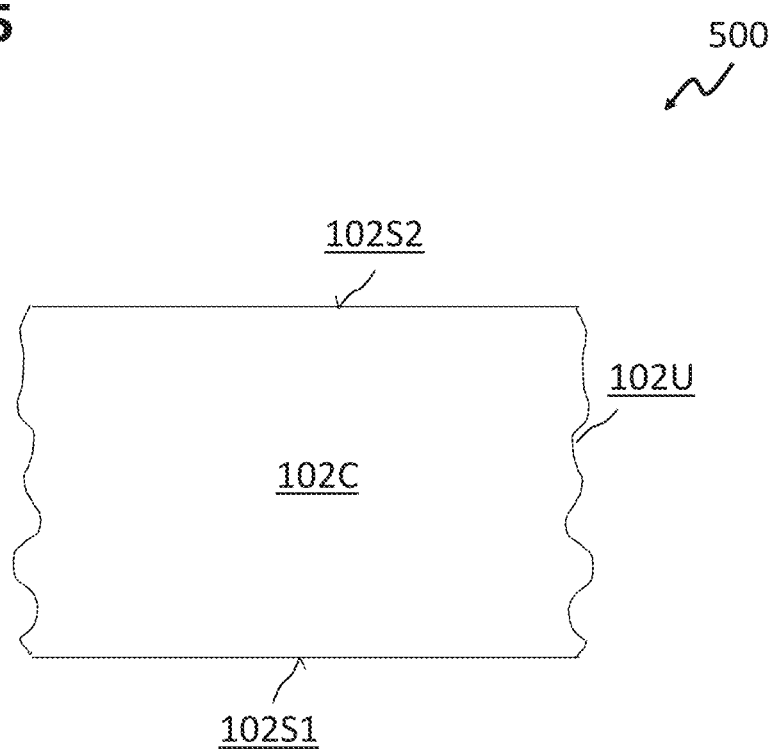
FIG. 5 shows a silicon carbide chip in accordance with various embodiments.

FIG. 5 shows a silicon carbide chip 102C in accordance with various embodiments.

The silicon carbide chip 102C may be formed from a silicon carbide wafer 102 using the method of processing silicon carbide containing crystalline substrate 102 as described above for dicing the wafer 102 into a plurality of silicon carbide chips 102C.

The silicon carbide chip 102C may include a first main surface 102S1, an opposite second main surface 102S2, and a side surface 102U connecting the first main surface 102S1 and the second main surface 102S2, wherein the side surface 102U is essentially orthogonal to the first main surface 102S1 and/or to the second main surface 102S2. At least a portion of the side surface 102U may have an undulating shape in a direction from the first main surface 102S1 to the second main surface 102S2.

The undulating shape may be formed by the two-part process described above, including the pyrolyzing process and the removing process, used for forming dicing kerfs in the substrate 102.

The undulating side surface 102U may have a plurality of protrusions P extending essentially parallel to the first main surface 102S1 and/or to the second main surface 102S2. A distance between adjacent protrusions of the plurality of protrusions may be in a range from about 1 µm to about 10 µm, e.g. from about 3 µm to about 7 µm, e.g. about 5 µm. The distance may depend on a thickness of the pyrolyzed layer 102P achieved by the pyrolyzing process. In a case of the thickness being essentially constant in each cycle, the protrusions P may have a regular distance. Otherwise, distances between adjacent protrusions P may vary.

In various embodiments, depending on how constant processing parameters are kept between different cycles, the undulating pattern may be regular (very constant) or irregular (less constant).

Similar to the Bosch process, the alternating processes of pyrolyzing and removing may allow for the forming of the essentially vertical side surface 102U (i.e., essentially rectangular with respect to the first main surface 102S1 and/or the second main surface 102S2), whereas in the prior art, side surfaces of plasma-etched silicon carbide chips are typically inclined, whereas side surfaces of sawed silicon carbide chips are usually at least partially damaged.

The chip 102C side surface 102U may furthermore be free from (e.g. tensile) stress and polycrystalline structures.

Figure 6:
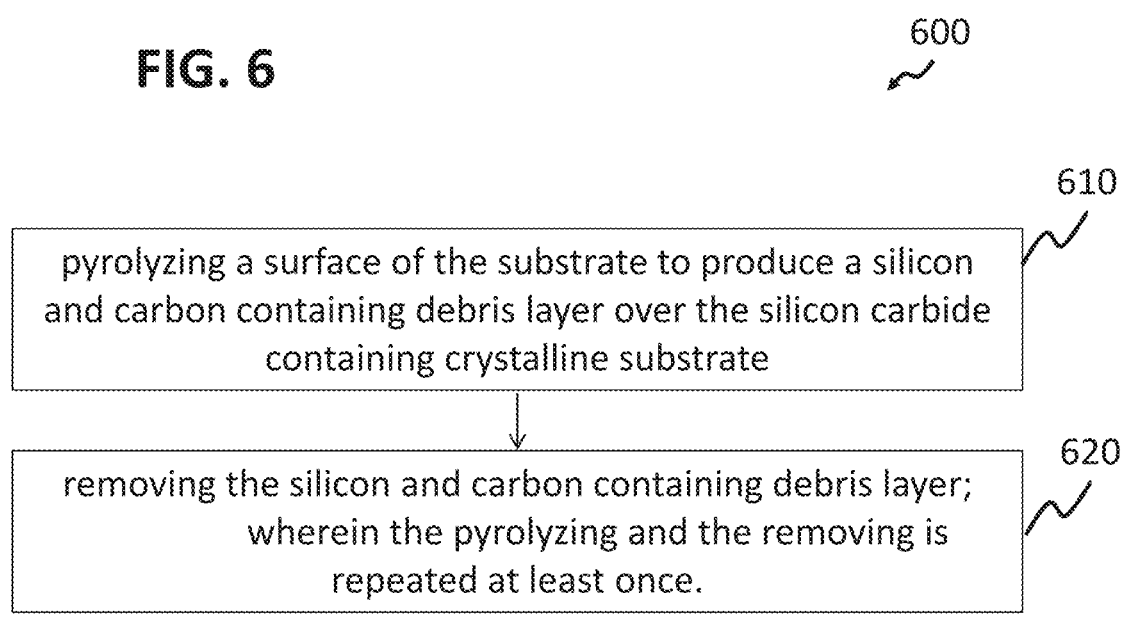
FIG. 6 shows a process flow of a method of processing a silicon carbide containing crystalline substrate in accordance with various embodiments.

FIG. 6 shows a process flow 600 of a method of processing a silicon carbide containing crystalline substrate in accordance with various embodiments.

The method may include pyrolyzing a surface of the substrate to produce a silicon and carbon containing debris layer over the silicon carbide containing crystalline substrate (in 610) and removing the silicon and carbon containing debris layer, wherein the pyrolyzing and the removing is repeated at least once (in 620).

Various examples will be illustrated in the following:

Example 1 is a method of processing silicon carbide containing crystalline substrate. The method may include pyrolyzing a surface of the substrate to produce a silicon and carbon containing debris layer over the silicon carbide containing crystalline substrate, and removing the silicon and carbon containing debris layer, wherein the pyrolyzing and the removing is repeated at least once.

In Example 2, the subject-matter of Example 1 may optionally include that the pyrolyzing comprises supplying energy to the surface.

In Example 3, the subject-matter of Example 1 or 2 may optionally include that the energy is supplied to the surface with an intensity in a range from about 1 J/cm$^2$ to less than 10 J/cm$^2$.

In Example 4, the subject-matter of Example 2 or 3 may optionally include that the energy is supplied to the surface with an intensity in a range from about 2 J/cm$^2$ to about than 5 J/cm$^2$.

In Example 5, the subject-matter of any of Examples 2 to 5 may optionally include that the energy is supplied to the surface using at least one energy supply device.

In Example 6, the subject-matter of Example 5 may optionally include that the supplying energy to the surface includes moving at least one energy supply device relative to the silicon carbide containing crystalline substrate or vice versa.

In Example 7, the subject-matter of Example 6 may optionally include that the moving the at least one energy supply device includes scanning the at least one energy supply device across the silicon carbide containing crystalline substrate, such that the pyrolyzed surface forms a continuous area.

In Example 8, the subject-matter of Example 7 may optionally include that the continuous area is a complete main surface of the silicon carbide containing crystalline substrate.

In Example 9, the subject-matter of Example 6 may optionally include that the moving the at least one energy supply device includes a combination of scanning and stepping the at least one energy supply device across the silicon carbide containing crystalline substrate, such that the pyrolyzed surface includes one or more areas of pyrolyzed silicon carbide adjacent to unpyrolyzed areas of silicon carbide.

In Example 10, the subject-matter of Example 9 may optionally include that the silicon carbide containing crystalline substrate is a silicon carbide wafer including a plurality of chips, and that the one or more areas of pyrolyzed silicon carbide are located in predefined separation regions between the plurality of chips.

In Example 11, the subject-matter of Example 1 to 7, 9 or 10 may optionally include that the repeating at least once includes repeating the pyrolyzing and the removing until an opening formed in the silicon carbide containing crystalline substrate by the pyrolyzing and the removing extends completely through the silicon carbide containing crystalline substrate.

In Example 12, the subject-matter of any of Examples 1 to 11 may optionally include that the pyrolyzing includes irradiating the surface with laser light.

In Example 13, the subject-matter of any of Examples 5 to 12 may optionally include that the energy supply device includes at least one laser.

In Example 14, the subject-matter of Example 13 may optionally include that the silicon carbide containing crystalline substrate is a silicon carbide wafer including a plurality of chips, and that the at least one laser is configured to irradiate predefined separation regions between the plurality of chips.

In Example 15, the subject-matter of Example 13 or 14 may optionally include that the at least one laser includes a plurality of lasers configured to simultaneously pyrolyze the silicon carbide containing crystalline substrate.

In Example 16, the subject-matter of Example 14 may optionally include that the at least one laser includes a plurality of lasers, and that each of the plurality of lasers is configured to irradiate a different separation region of the predefined separation regions.

In Example 17, the subject-matter of any of Example 1 to 11 may optionally include that the pyrolyzing includes micro-spark eroding the surface.

In Example 18, the subject-matter of Example 17 may optionally include that the micro-spark eroding the surface includes arranging at least one wire above the surface.

In Example 19, the subject-matter of Example 17 may optionally include that the micro-spark eroding the surface includes arranging a plurality of wires above the surface.

In Example 20, the subject-matter of Example 19 may optionally include that the plurality of wires are arranged parallel to each other.

In Example 21, the subject-matter of Example 19 may optionally include that the plurality of wires are arranged as a grid.

In Example 22, the subject-matter of any of Examples 19 to 21 may optionally include that the silicon carbide containing crystalline substrate is a silicon carbide wafer including a plurality of chips, and that the plurality of wires is arranged above predefined separation regions between the plurality of chips.

In Example 23, the subject-matter of any of Examples 19 to 22 may optionally include that the plurality of wires are configured to simultaneously pyrolyze the surface.

In Example 24, the subject-matter of any of Examples 1 to 23 may optionally include that the removing the silicon and carbon containing debris layer includes etching with an etchant suitable for removing the debris layer.

In Example 25, the subject-matter of Example 24 may optionally include that the etching includes plasma etching or wet etching.

In Example 26, the subject-matter of Example 24 or 25 may optionally include that the etchant includes, consists of or essentially consists of Ar, $O_2$, and $SF_6$.

In Example 27, the subject-matter of Example 24 or 25 may optionally include that the etchant includes, consists of or essentially consists of e.g. a mixture of $H_2SO_4$, HF, $HNO_3$ and $H_3PO_4$.

In Example 28, the subject-matter of any of Examples 1 to 27 may optionally include that the silicon carbide containing crystalline substrate is a silicon carbide wafer including a plurality of chips, the wafer having a front side including active areas of the plurality of chips, and a back side opposite the front side.

In Example 29, the subject-matter of Example 28 may optionally further include mounting the wafer on a carrier with the front side facing the carrier, wherein the pyrolyzing the surface and the removing the silicon and carbon containing debris layer are performed on the back side of the wafer.

In Example 30, the subject-matter of any of Examples 1 to 29 may optionally further include arranging a structured mask layer over the silicon carbide containing crystalline substrate configured to mask at least one region of the silicon carbide containing crystalline substrate from the etchant.

In Example 31, the subject-matter of Example 30 may optionally include that the arranging the structured mask layer includes arranging an unstructured mask layer over the silicon carbide containing crystalline substrate and structuring the unstructured mask layer using a laser.

In Example 32, the subject-matter of Example 31 may optionally include that the laser is further used for the pyrolyzing of the surface.

In Example 33, the subject-matter of Examples 28 and 30 may optionally further include mounting the wafer on a carrier with the back side facing the carrier, wherein the pyrolyzing the surface and the removing the silicon and carbon containing debris layer are performed on the front side of the wafer.

In Example 34, the subject-matter of any of Examples 1 to 33 may optionally include that the pyrolyzing the surface and the removing the silicon and carbon containing debris layer are performed in a common process chamber.

In Example 35, the subject-matter of any of Examples 1 to 34 may optionally include that the pyrolyzing is configured to produce the silicon and carbon containing debris layer with a thickness of between 1 μm and 10 μm.

In Example 36, the subject-matter of Example 35 may optionally include that the pyrolyzing is configured to produce the silicon and carbon containing debris layer with a thickness of between 3 μm and 7 μm, e.g. with a thickness of about 5 μm.

Example 37 is a processing chamber. The processing chamber may include an energy supply device configured to pyrolyze a surface of a silicon carbide containing crystalline substrate to produce a silicon and carbon containing debris layer over the silicon carbide containing crystalline substrate, and a removing device configured to remove the silicon and carbon containing debris layer; wherein the processing chamber is further configured to repeat the pyrolyzing and the removing at least once.

In Example 38, the subject-matter of Example 37 may optionally include that the processing chamber is further configured to have the substrate remain in the processing chamber between the pyrolyzing and the removing.

In Example 39, the subject-matter of Example 37 or 38 may optionally include that the removing device is an etching device.

In Example 40, the subject-matter of any of Examples 37 to 39 may optionally include that the energy supply device includes at least one laser or a micro-spark erosion device.

In Example 41, the subject-matter of any of Examples 37 to 40 may optionally further include a moveable substrate support structure configured to move the substrate from a position for the pyrolyzing to a position for the etching and vice versa.

In Example 42, the subject-matter of Example 41 may optionally include that the moveable substrate support structure is further configured to move the substrate during the pyrolyzing in order to scan the energy supply device across the substrate.

In Example 43, the subject-matter of any of Examples 37 to 42 may optionally include that the energy supply is movable and configured to move during the pyrolyzing in order to scan across the substrate, or that the removal device is moveable and configured to move during the etching.

In Example 44, the subject-matter of any of Examples 37 to 42 may optionally include that the energy supply is movable and configured to move during the pyrolyzing in order to scan across the substrate, and that the removal device is moveable and configured to move during the etching.

In Example 45, the subject-matter of any of Examples 37 to 44 may optionally further include a motion control unit configured to control a respective motion of all moveable devices, i.e. the motion of only the moveable substrate support, or the motion of the moveable substrate support and the motion of the moveable energy supply device, or the motion of the moveable substrate support and the motion of the moveable removal device, or the motion of the moveable energy supply device and the motion of the moveable removal device, or the motion of the moveable substrate support and the motion of the moveable energy supply device, and the motion of the moveable removal device.

In Example 46, the subject-matter of Example 45 may optionally include that the motion control unit is configured to coordinate the motion of the moveable substrate support with the motion of the energy supply device and/or the motion of the moveable substrate support with the motion of the removal device.

Example 47 is a silicon carbide chip. The silicon carbide chip may include a first main surface, an opposite second main surface, and a side surface connecting the first main surface and the second main surface, wherein the side surface is essentially orthogonal to the first main surface and/or to the second main surface, and wherein at least a portion of the side surface has an undulating shape in a direction from the first main surface to the second main surface.

In Example 48, the subject-matter of Example 47 may optionally include that the undulating side surface has a plurality of protrusions extending essentially parallel to the first main surface and/or to the second main surface.

In Example 49, the subject-matter of Example 48 may optionally include that a distance between adjacent protrusions of the plurality of protrusions is in a range from about 1 μm to about 10 μm, e.g. from about 3 μm to about 7 μm, e.g. about 5 μm.

In Example 50, the subject-matter of Example 49 may optionally include that the distance between each of the protrusions and its adjacent protrusion is the same.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of processing silicon carbide containing crystalline substrate, the method comprising:
    pyrolyzing a surface of the silicon carbide containing crystalline substrate to produce a silicon and carbon containing debris layer over the silicon carbide containing crystalline substrate; and
    removing the silicon and carbon containing debris layer, wherein the pyrolyzing and the removing is repeated at least once.

2. The method of claim 1, wherein the pyrolyzing comprises supplying energy to the surface.

3. The method of claim 2, wherein the energy is supplied to the surface with an intensity in a range from about 1 J/cm$^2$ to less than 10 J/cm$^2$.

4. The method of claim 2, wherein the energy is supplied to the surface using at least one energy supply device.

5. The method of claim 4, wherein supplying energy to the surface comprises moving the at least one energy supply device relative to the silicon carbide containing crystalline substrate or vice-versa.

6. The method of claim 5, wherein moving the at least one energy supply device comprises a combination of scanning and stepping the at least one energy supply device across the silicon carbide containing crystalline substrate, such that the pyrolyzed surface comprises one or more areas of pyrolyzed silicon carbide adjacent to unpyrolyzed areas of silicon carbide.

7. The method of claim 6, wherein the silicon carbide containing crystalline substrate is a silicon carbide wafer comprising a plurality of chips, and wherein the one or more areas of pyrolyzed silicon carbide are located in predefined separation regions between the plurality of chips.

8. The method of claim 1, wherein the repeating at least once comprises repeating the pyrolyzing and the removing until an opening formed in the silicon carbide containing crystalline substrate by the pyrolyzing and the removing extends completely through the silicon carbide containing crystalline substrate.

9. The method of claim 1, wherein the pyrolyzing comprises irradiating the surface with laser light.

10. The method of claim 1, wherein the pyrolyzing comprises micro-spark eroding the surface.

11. The method of claim 10, wherein micro-spark eroding the surface comprises arranging at least one wire above the surface.

12. The method of claim 10, wherein micro-spark eroding the surface comprises arranging a plurality of wires above the surface.

13. The method of claim 12, wherein the plurality of wires are arranged as a grid.

14. The method of claim 12, wherein the silicon carbide containing crystalline substrate is a silicon carbide wafer comprising a plurality of chips, and wherein the plurality of wires is arranged above predefined separation regions between the plurality of chips.

15. The method of claim 1, wherein removing the silicon and carbon containing debris layer comprises etching with an etchant suitable for removing the silicon and carbon containing debris layer.

16. The method of claim 15, wherein the etching comprises plasma etching or wet etching.

17. The method of claim 16, wherein the etchant comprises Ar, $O_2$, and $SF_6$.

18. The method of claim 1, wherein the silicon carbide containing crystalline substrate is a silicon carbide wafer comprising a plurality of chips, the wafer having a front side comprising active areas of the plurality of chips, and a back side opposite the front side.

19. The method of claim 18, further comprising:
    mounting the silicon carbide wafer on a carrier with the front side facing the carrier,
    wherein pyrolyzing the surface and the removing the silicon and carbon containing debris layer are performed on the back side of the wafer.

20. The method of claim 18, further comprising:
    mounting the silicon carbide wafer on a carrier with the back side facing the carrier,
    wherein pyrolyzing the surface and the removing the silicon and carbon containing debris layer are performed on the front side of the wafer.

21. The method of claim 1, further comprising:
    arranging a structured mask layer over the silicon carbide containing crystalline substrate, the structured mask layer being configured to mask at least one region of the silicon carbide containing crystalline substrate from an etchant used to remove the silicon and carbon containing debris layer.

22. The method of claim 21, wherein arranging the structured mask layer comprises arranging an unstructured mask layer over the silicon carbide containing crystalline substrate and structuring the unstructured mask layer using a laser, wherein the laser is further used for the pyrolyzing of the surface.

23. The method of claim 1, wherein pyrolyzing the surface and the removing the silicon and carbon containing debris layer are performed in a common process chamber.

24. The method of claim 1, wherein the pyrolyzing is configured to produce the silicon and carbon containing debris layer with a thickness of between 1 μm and 10 μm.

25. A processing chamber, comprising:
   an energy supply device configured to pyrolyze a surface of a silicon carbide containing crystalline substrate to produce a silicon and carbon containing debris layer over the silicon carbide containing crystalline substrate; and
   a removing device configured to remove the silicon and carbon containing debris layer,
   wherein the processing chamber is further configured to repeat the pyrolyzing and the removing at least once.

26. The processing chamber of claim 25, wherein the processing chamber is further configured to have the silicon carbide containing crystalline substrate remain in the processing chamber between the pyrolyzing and the removing.

27. The processing chamber of claim 25, wherein the removing device is an etching device.

28. The processing chamber of claim 25, wherein the energy supply device comprises at least one laser or a micro-spark erosion device.

29. The processing chamber of claim 25, further comprising a moveable substrate support structure configured to move the silicon carbide containing crystalline substrate from a position for the pyrolyzing to a position for the etching and vice-versa.

30. The processing chamber of claim 29, wherein the moveable substrate support structure is further configured to move the silicon carbide containing crystalline substrate during the pyrolyzing in order to scan the energy supply device across the silicon carbide containing crystalline substrate.

31. A silicon carbide chip, comprising:
   a first main surface;
   a second main surface opposite the first main surface; and
   a side surface connecting the first main surface and the second main surface,
   wherein the side surface is essentially orthogonal to the first main surface and/or to the second main surface,
   wherein at least a portion of the side surface has an undulating shape in a direction from the first main surface to the second main surface.

* * * * *